US007911020B2

(12) United States Patent
Niimura et al.

(10) Patent No.: US 7,911,020 B2
(45) Date of Patent: Mar. 22, 2011

(54) SEMICONDUCTOR DEVICE HAVING BREAKDOWN VOLTAGE MAINTAINING STRUCTURE AND ITS MANUFACTURING METHOD

(75) Inventors: Yasushi Niimura, Nagano (JP); Takashi Kobayashi, Matsumoto (JP); Masanori Inoue, Nagano (JP); Yasuhiko Onishi, Nagano (JP)

(73) Assignee: Fuji Electric Systems Co., Ltd. (JP)

( * ) Notice: Subject to any disclaimer, the term of this patent is extended or adjusted under 35 U.S.C. 154(b) by 286 days.

(21) Appl. No.: 12/171,193

(22) Filed: Jul. 10, 2008

(65) Prior Publication Data
US 2009/0045481 A1    Feb. 19, 2009

(30) Foreign Application Priority Data

Jul. 12, 2007    (JP) .................................. 2007-183530

(51) Int. Cl.
*H01L 29/02* (2006.01)

(52) U.S. Cl. ................ 257/487; 257/495; 257/E29.013; 438/140

(58) Field of Classification Search .................. 438/133, 438/135, 137, 138, 140; 257/127, 170, 409, 257/452, 484, 605, E29.012, E29.013, E29.027, 257/487, 495

See application file for complete search history.

(56) References Cited

U.S. PATENT DOCUMENTS

| | | | |
|---|---|---|---|
| 4,602,266 A | 7/1986 | Coe | |
| 4,750,028 A | 6/1988 | Ludikhuize | |
| 4,774,560 A | 9/1988 | Coe | |
| 5,345,101 A * | 9/1994 | Tu | 257/495 |
| 5,629,552 A * | 5/1997 | Zommer | 257/490 |
| 6,911,692 B2 * | 6/2005 | Kobayashi et al. | 257/329 |
| 7,115,475 B2 * | 10/2006 | Yamaguchi et al. | 438/268 |
| 7,642,599 B2 * | 1/2010 | Ninomiya et al. | 257/355 |
| 2003/0218220 A1 * | 11/2003 | Takahashi et al. | 257/409 |
| 2004/0150040 A1 * | 8/2004 | Nitta et al. | 257/342 |

FOREIGN PATENT DOCUMENTS

| | | |
|---|---|---|
| JP | 58-108771 A | 6/1983 |
| JP | 58-114434 A | 7/1983 |
| JP | 59-141267 A | 8/1984 |
| JP | 61-013664 A | 1/1986 |
| JP | 05-063213 A | 3/1993 |
| JP | 06-334188 A | 12/1994 |
| JP | 08-306937 A | 11/1996 |

* cited by examiner

*Primary Examiner* — Khiem D Nguyen

(74) *Attorney, Agent, or Firm* — Rossi, Kims & McDowell LLP

(57) ABSTRACT

A semiconductor device has an active portion having at least one well region in a semiconductor layer, and a breakdown voltage maintaining structure surrounding the active portion. The maintaining structure includes a conductor layer over each of a plurality of guard rings with an insulating film interposed in between and connected to the respective guard ring. An inner side end portion of each conductor layer projects over the immediate adjacent inner side guard ring. The impurity concentration of the guard rings is set between the impurity concentrations of the semiconductor layer and the well regions. A field plate can extend over the innermost conductor layer with the insulating film interposed in between. The field plate is in contact with the outermost well region and is in contact with the first conductor layer. The outer side end of the field plate extends outwardly beyond an outer side end of the innermost conductor layer. With these arrangements, the guard rings can be shortened and the chip size can be reduced. Furthermore, the device can be made less susceptible to external charge.

20 Claims, 6 Drawing Sheets

SEMICONDUCTOR DEVICE HAVING BREAKDOWN VOLTAGE MAINTAINING STRUCTURE AND ITS MANUFACTURING METHOD

BACKGROUND

To maintain a high breakdown voltage, vertical high-breakdown-voltage semiconductor devices, such as power MOSFETs and power IGBTs, have a breakdown voltage maintaining structure in a peripheral portion of a semiconductor substrate. Various types of breakdown voltage maintaining structures are available, such as a field plate structure, a mesa structure, a guard ring structure, a multi-step field plate structure, and a RESURF (reduced surface field), which are all well known.

The guard ring structure will be described below in reference to FIGS. 4A and 4B. FIG. 4A is a plan view illustrating the configuration of an important part of a vertical power MOSFET having a conventional guard ring structure. FIG. 4B is an enlarged sectional view of section G of FIG. 4A. The active region or portion 26 of the MOSFET includes p-well regions 2 formed as surface layers in an n-type semiconductor substrate 1, and n-type source regions 3 formed as surface layers in each p-well region 2. Each gate electrode 5 is formed over portions, interposed between a portion of the semiconductor substrate 1 and the n-type source regions 3 in the p-well regions 2, with a gate oxide film 4 interposed in between. An interlayer insulating film 6 is formed on and over each gate electrode 5, and a source electrode 7 is formed on and over the n-type source regions 3 and the interlayer insulating films 6. An n-type drain region (not shown) is formed on the back surface side of the n-type semiconductor substrate 1 and a drain electrode (not shown) is formed on the n-type drain region.

The breakdown voltage maintaining structure is formed in a peripheral portion, which is located around the active portion 26. Loop-shaped p-type guard rings 51 are formed as surface layers in the n-type semiconductor substrate 1 at the same impurity concentration and with the same diffusion depth as the p-well regions 2, and spaced from the outermost p-well region 2. An insulating film 54 is formed on the p-type guard rings 51, and a loop-shaped metal film 55 (Al—Si films) is formed on the insulating film 54 connected to every other p-type guard ring 51. A p-type contact region 53 is formed in every other p-type guard ring 51 at the corners (i.e., at the positions corresponding to the chip corners) and is connected to the corresponding metal film 55 through a contact hole 56. A p-type stopper region 57 is formed as a surface layer of the n-type semiconductor substrate 1 and extending fully around adjacent to the outer periphery of the chip. A p-type contact region 53 is formed as a surface layer of the p-type stopper region 57, and is connected to a metal film 55 through a contact hole 56 formed through the insulating film 54. The active portion 26 is located at the center of the chip and the breakdown voltage maintaining structure is located around the active portion 26. The breakdown voltage maintaining structure is composed of the p-type guard ring forming portion 58, which is located around the active portion 26 and an end structure. The p-type contact regions 53 and the contact holes 56 are formed at the corners of the breakdown voltage maintaining structure, that is, at the positions corresponding to the chip corners. In certain cases, the p-type contact regions 53 and the contact holes 56 are formed completely around in the breakdown voltage maintaining structure.

Referring to FIG. 5, which is an enlarged version of section E of FIG. 4B illustrating an equipotential line diagram of the guard ring forming portion 58, equipotential lines 59 that pass between the metal films 55 and extend outwardly are dense in a region F, which is near a curved portion 52 on the inside p-type guard ring 51. The electric field strength is high near the curved portion 52. The guard ring forming portion 58 is designed so that the peak values of the electric field strength of the respective p-type guard rings 51 become approximately identical. With the conventional p-type guard rings 51, the p-type guard ring forming portion 58 is elongated to decrease the peak values of electric field strength to, for example, about $2 \times 10^5$ V/cm or less.

JP-A-8-306937 discloses a breakdown voltage maintaining structure, which is a combination of a low-impurity-concentration RESURF structure and a guard ring structure, that does not use a field plate whose conductivity decreases at low temperature. As shown in FIG. 4A, as the p-type guard ring forming portion 58 becomes longer, the chip area increases, increasing the manufacturing cost. To avoid this problem, a RESURF structure, for example, is employed.

FIG. 6 is a sectional view of an important part of a vertical power MOSFET having a RESURF structure. Here, the active portion 26 is the same as the one shown in FIG. 4B. A p-type region 61 (RESURF region) is formed as a surface layer in an n-type semiconductor substrate 1 and connected to an outermost p-well region 2, and a field plate 66 is formed over the p-type region 61 with an insulating film 64 interposed in between. The field plate 66 is formed by extending a source electrode 7. A breakdown voltage maintaining structure, which is composed of the p-type region 61 and an end structure, is formed around the active portion 26. A p-type stopper region 62 is formed completely around the outer periphery of the chip. The impurity concentration of the p-type stopper region 62 is low because it is formed at the same time as the p-type region 61. Therefore, a high-impurity-concentration p-type contact region 63 is formed as a surface layer in the p-type stopper region 62 fully around the periphery of the chip. Part of the insulating film 64 is formed on the p-type contact region 63. The p-type contact region 63 is connected to a metal film 67 through a contact aperture 65 formed through the insulating film 64 fully around the periphery of the chip.

In this RESURF structure, the expanse of a depletion layer is susceptible to external charge because the impurity concentration of the p-type region 61 is as low as that of the n-type semiconductor substrate 1. To avoid this problem, it is necessary to form a thick insulating film 64 on the p-type region 61. Forming a thick insulating film 64 increases the manufacturing time and cost.

JP-A-8-306937 mentioned above does not disclose extending the metal film (Al electrode) formed on a guard ring over to the immediate inside guard ring. In this guard ring structure, although the guard rings have uniform electric field strength, the electric field strength itself is high, necessitating a long guard ring forming portion.

Accordingly, there remains a need for a semiconductor device having a small chip area and less susceptible to external charge. The present invention addresses this need.

SUMMARY OF THE INVENTION

The present invention relates to semiconductor devices, such as a power MOSFET and a power IGBT (insulated gate bipolar transistor), having a breakdown voltage maintaining structure formed in a peripheral portion of its semiconductor substrate. The present invention also relates to its manufacturing method.

One aspect of the present invention is a semiconductor device. The device can include a semiconductor layer of a first conductivity type, and an active portion having at least one well region of a second conductivity type selectively positioned in the semiconductor layer, and a breakdown voltage maintaining structure surrounding the active portion.

The breakdown voltage maintaining structure can include a first semiconductor region of the second conductivity type in the semiconductor layer at an impurity concentration lower than that of the well regions and higher than that of the semiconductor layer, and surrounding and in contact with an outermost one of the well regions. The structure can further include at least one second semiconductor region of the second conductivity type at the same impurity concentration and with the same diffusion depth as the first semiconductor region in the semiconductor layer, and surrounding the first semiconductor region. The structure can further include a first conductor layer positioned over the first semiconductor region with an insulating film interposed in between, and a second conductor layer positioned over the second semiconductor region with the insulating film interposed in between. The second conductor layer can be in contact with the second semiconductor region. The first conductor layer and the second conductor layer can be spaced from each other. The inner side end portion of the second conductor layer can extend over to the first semiconductor region, and the first conductor layer can be in electrical contact with the outermost well region.

A plurality of the second semiconductor region can be provided. The second conductor layer can be positioned over and in contact with each of the second semiconductor regions with the insulating film interposed in between. The second conductor layers can be spaced from each other. The innermost one of the second semiconductor regions can be in contact with the first semiconductor region. The inner side end portion of the second conductor layer associated with the innermost second semiconductor region can extend over to the first semiconductor region. The inner side end portion of the second conductor layer associated with an outermost one of the second semiconductor regions can extend over to the second semiconductor region adjacent thereto.

The second semiconductor regions can overlap, be in contact with the adjacent one, or spaced from the adjacent one(s). The amount of spacing between adjacent second semiconductor regions can become wider as the second semiconductor regions are positioned farther outwardly from the first semiconductor region. The boundary between each of the first and second semiconductor regions and the semiconductor layer can include a curved portion or area. The adjacent end portions of adjacent curved portions can overlap, touch, or have a gap therebetween. The spacing between the overlap or gap can become wider as the second semiconductor regions are position farther outwardly from the first semiconductor region.

Each of the first semiconductor region, the second semiconductor regions, the first conductor layer, and the second conductor layers can be loop shaped. The second semiconductor regions can be guard rings. The breakdown voltage maintaining structure can further include contact regions in the second semiconductor regions at an impurity concentration that is higher than that of the second semiconductor regions.

The surface concentration of the well region can be more than 100 times higher than the impurity concentration of the semiconductor layer, and the surface concentrations of the first and second semiconductor regions can be 10 to 100 times higher than the impurity concentration of the semiconductor layer.

Another aspect of the semiconductor device can include the active portion on the semiconductor layer and a breakdown voltage maintaining structure surrounding the active portion. The breakdown voltage maintaining structure can include the first semiconductor region, the at least one second semiconductor region surrounding the first semiconductor region, and the first conductor layer positioned over the first semiconductor region with a first insulating film interposed in between. A first field plate can be positioned over the first conductor layer with a second insulating film interposed in between. The first field plate can be in contact with the outermost well region and can be in contact with the first conductor layer. The outer side end of the first field plate can extend outwardly beyond the outer side end of the first conductor layer.

When a plurality of the second semiconductor region is provided, the second conductor layer can be positioned over the outermost second semiconductor region and the semiconductor layer with the first insulating film interposed in between. A second field plate can be positioned over the second conductor layer with the second insulating film interposed in between. The second field plate can be in contact with the outermost second semiconductor region, and the outer side end of the second field plate can extend outwardly beyond the outer side end of the second conductor layer.

Each of the first semiconductor region, the second semiconductor region, and the first conductor layer, and the second conductor layer can be loop shaped. Each of the conductor layers can be composed of a low-resistivity layer, a metal film, or a lamination of a low-resistivity layer and a metal film. The low-resistivity layer can be made of polysilicon.

The outermost second semiconductor region can be spaced from the adjacent second semiconductor region, while remaining second semiconductor regions can be overlapping or in contact with the adjacent second semiconductor regions.

Another aspect of the present invention is a method of forming the above described semiconductor device. The method can include forming the active portion in the semiconductor layer, forming the breakdown voltage maintaining structure surrounding the active portion. This structure can be formed by forming the first semiconductor region in the semiconductor layer, and surrounding and in contact with the outermost well region, forming the at least one second semiconductor region in the semiconductor layer and surrounding the first semiconductor region, forming the first conductor layer positioned over the first semiconductor region with the insulating film interposed in between, forming the second conductor layer positioned over the second semiconductor region with the insulating film interposed in between. The second conductor layer can be in contact with the second semiconductor region, the first conductor layer and the second conductor layer can be spaced from each other, the inner side end portion of the second conductor layer can extend over to the first semiconductor region, and the first conductor layer can be in electrical contact with the outermost well region.

The method can further include forming a first field plate positioned over the first conductor layer with the insulating film interposed in between, with the first field plate in contact with the outermost well region and in contact with the first conductor layer, and with an outer side end of the first field plate extending outwardly beyond an outer side end of the first conductor layer. The step of forming the second semiconductor device includes forming a plurality of the second semiconductor region. The method can further include forming the second conductor layer positioned over the outermost second semiconductor region and the semiconductor layer with the first insulating film interposed in between, and forming the second field plate positioned over the second conductor layer with the second insulating film interposed in between. The second field plate can be in contact with the outermost second semiconductor region, and the outer side end of the second field plate can extend outwardly beyond an outer side end of the second conductor layer.

DETAILED DESCRIPTION

Figure 1:
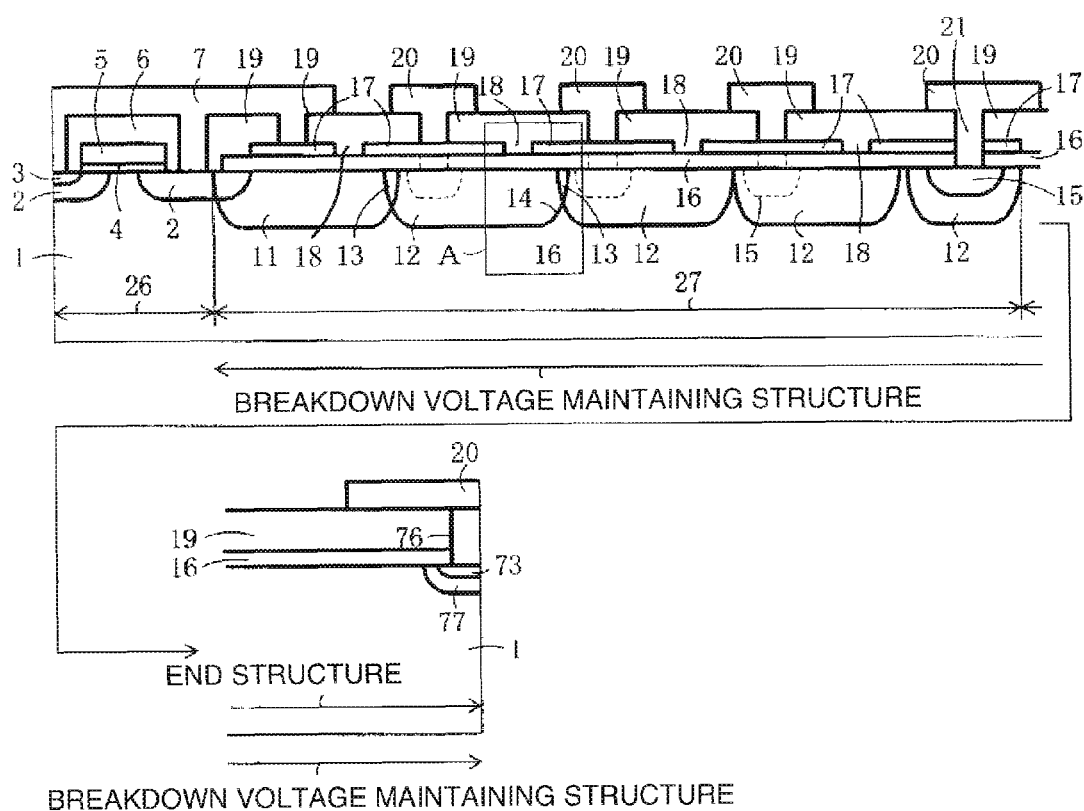
FIG. 1 is a sectional view of a first embodiment of a semiconductor device according to the present invention.

Although the first and second conductivity types are the n type and the p type, respectively, the designation can be the opposite. Furthermore, portions having the same portions as the structures illustrated in FIGS. 4A-6 are given the same reference numerals.

Referring to FIG. 1, the first embodiment of the semiconductor device, which can be a vertical power MOSFET, has an active region 26 of the MOSFET and a breakdown voltage maintaining structure in a form of a p-type guard ring forming portion 27. The active portion 26 of the MOSFET can have one or more p-well regions 2 formed as surface layers in an n-type semiconductor substrate 1, n-type source regions 3 formed as surface layers in each p-well region 2, and gate electrodes 5 each formed over portions interposed between a portion of the semiconductor substrate 1 and the n-type source regions 3 in the p-well regions 2, with a gate oxide film 4 interposed in between. An interlayer insulating film 6 is formed on and over each gate electrode 5, and a source electrode 7 is formed on and over the n-type source regions 3 and the interlayer insulating films 6. An n-type drain region (not shown) is formed on the back surface side of the n-type semiconductor substrate 1 and a drain electrode (not shown) is formed on the n-type drain region. The active portion 26 can be the same as shown in FIG. 4B.

The p-type guard ring forming portion 27, which is part of the breakdown voltage maintaining structure formed around the active layer 26, has a p-type region 11 (e.g., first semiconductor region) having a loop configuration formed as a surface layer in the n-type semiconductor substrate 1 at a lower impurity concentration and with a greater diffusion depth than the p-well region(s) 2, and connected to and surrounds the outermost p-well region 2. P-type guard rings 12 (e.g., second semiconductor region) each having a loop configuration can be formed at the same impurity concentration and with the same diffusion depth as the p-type region 11, with the innermost p-type guard ring 12 surrounding the p-type region 11 and its inside end portion connected to the p-type region 11. In the embodiment of FIG. 1, four p-type guard rings 12 are illustrated, with the adjacent guard rings 12 overlapping or touching. The overlap 13 between the adjacent p-type guard rings 12 gradually can become smaller as they are positioned toward the outer periphery of the chip (i.e., away from the p-type region), as illustrated in FIG. 1. Moreover, the outermost p-type guard ring 12 can be spaced from the immediate adjacent ring 12. Arranging the p-type guard rings 12 in this manner can make the peak values of electric field strength in the curved portions 14 of the respective p-type guard rings 12 uniform. A p-type stopper region 77 can be formed as a surface layer in the n-type semiconductor substrate 1 adjacent to the outer periphery of the chip. A p-type contact region 73 is formed as a surface layer in the p-type stopper region 77, and is connected to an outermost metal film 20 through a contact aperture 76 formed through the insulating films 16 and 19.

Figure 4A:
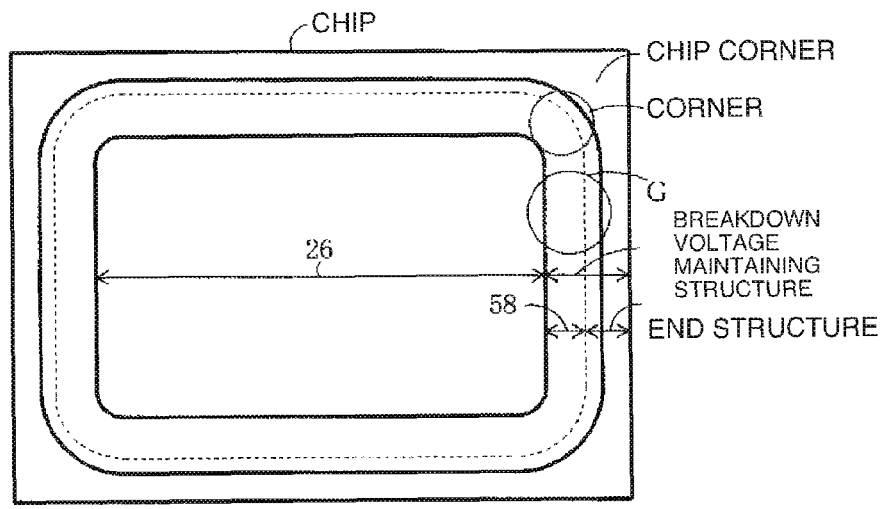
FIG. 4A is a plan view showing the configuration of an important part of a vertical power MOSFET having a conventional guard ring structure.
Figure 4B:
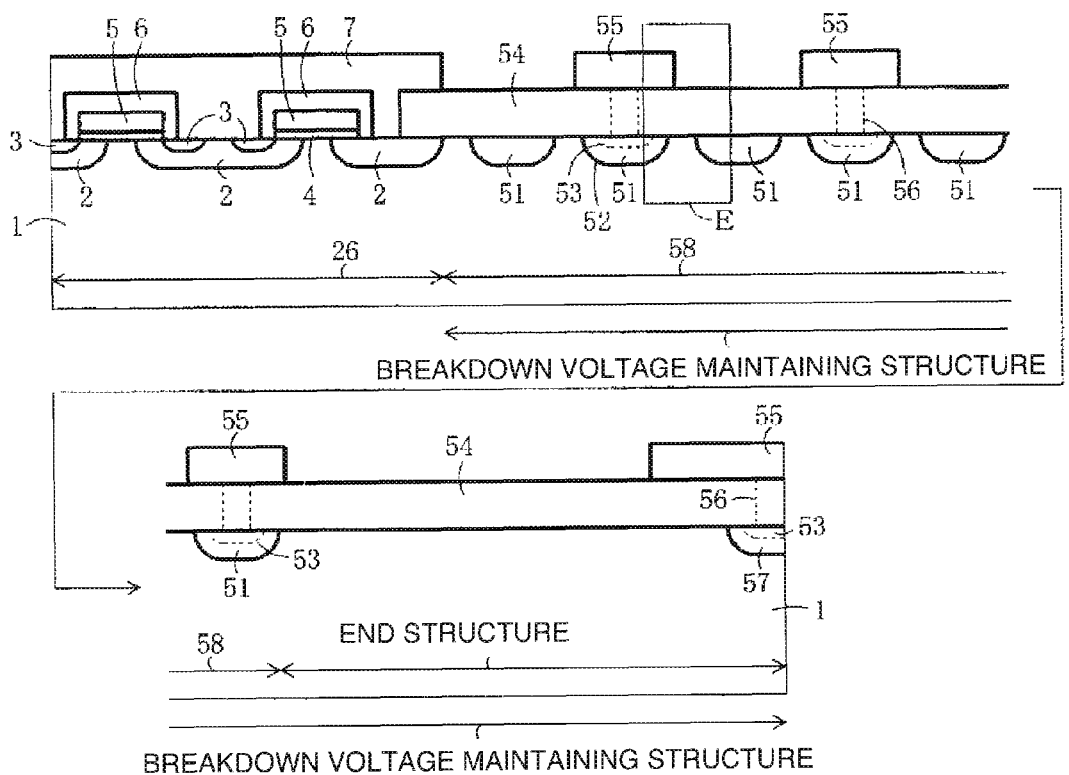
FIG. 4B is an enlarged sectional view of section G of FIG. 4A.
Figure 5:
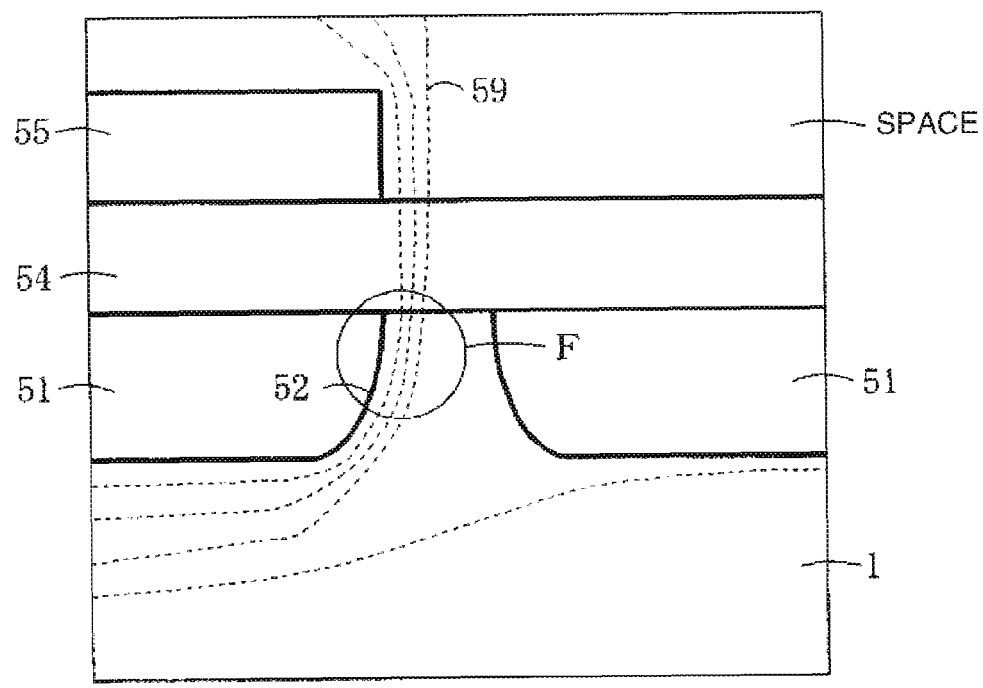
FIG. 5 is an equipotential line diagram of a conventional guard ring forming portion.
Figure 6:
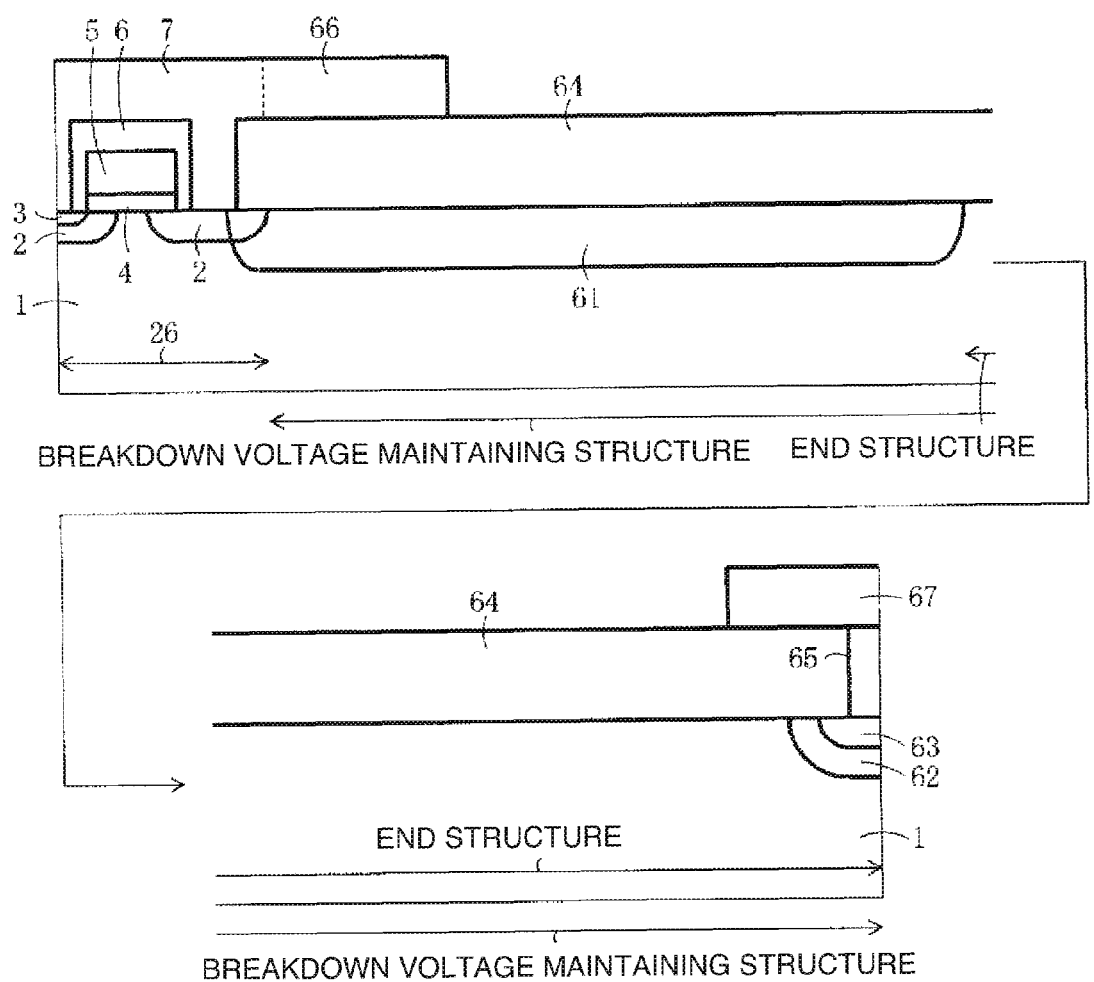
FIG. 6 is a sectional view of a vertical power MOSFET having a RESURF structure.

In a plan view above the chip, as in the case of FIG. 4A, the active portion 26 is generally located at the center of the chip and the breakdown voltage maintaining structure is located around the active portion 26. The breakdown voltage maintaining structure is composed of the p-type guard ring forming portion 27 located around the active portion 26 and the end structure. In the breakdown voltage maintaining structure, the p-type stopper region 77, the p-type contact region 73, and the contact aperture 76 of the end structure can be formed fully around the outer periphery of the chip and surround the p-type guard ring forming portion 27.

The detailed description of the p-well region 2, the p-type region 11, and the p-type guard rings 12 follows. The diffusion depth of the p-well regions 2 can be about 3 μm, for example. The diffusion depth of the p-type region 11 and the p-type guard rings 12 can be greater than that of the p-well regions 2 and about 5 μm, for example. The surface concentration of the p-well regions 2 can be set at about $2 \times 10^{17}$ cm$^{-3}$, for example, and that of the p-type region 11 and the p-type guard rings 12 can be set at about $2 \times 10^{15}$ cm$^{-3}$, for example.

A p-type contact region 15 can be formed as a surface layer in each p-type guard ring 12. The p-type contact regions 15 can be basically formed at the corners of the guard rings 12, namely at the positions corresponding to the chip corners. In the outermost p-type guard ring 12, however, the p-type contact region 15 can be formed fully around along the periphery and at a higher impurity concentration than the p-type guard ring 12 and connected to a conductor layer 17, and a metal film 20 through a contact hole 21 formed fully around its periphery (a contact hole formed fully around the periphery is also called "contact aperture"). The insulating film 16 is formed on the p-type region 11 and the p-type guard rings 12. The conductor layers 17 are formed on the insulating film 16. The conductor layers 17 are low-resistivity layers and can be made of polysilicon, metal films, or lamination films of a low-resistivity layer and a metal film. The insulating film 19 is formed on the conductor layers 17, and metal films 20, such as Al—Si films, are formed on the insulating film 19. The p-type contact region 15 of each p-type guard ring 12 is electrically connected to the associated metal film 20 and conductor layer 17 through the associated contact hole 21 formed through the insulating films 16 and 19. Since metal films 20 are provided to connect the p-type guard rings 12 to the conductor layers 17, the metal films 20 are not always necessary if the p-type guard rings 12 are electrically connected to the conductor layers 17 reliably.

According to one aspect of the present device, the conductor layer 17, which formed over each p-type guard ring 12, can extend to the immediate adjacent inside p-type guard ring 12, with a gap or spacing 18 between each adjacent pair of conductor layers 17. According to another aspect of the present device, the source electrode 7 can extend outwardly over to at least the p-type region 11 to form a field plate, as illustrated in FIG. 1. The source electrode 7 is in contact with the conductor layer 17 formed on the p-type region 11 through the field plate. Accordingly, the p-well region 2 is electrically in contact with the conductor layer 17 through the source electrode/field plate.

The surface concentration of the p-type guard rings 12 can be set lower than that of the p-well regions 2 and higher than the impurity concentration of the n-type semiconductor substrate 1. If the surface concentration of the p-type guard rings 12 were higher than that of the p-well regions 2, depletion layers would be extremely difficult to develop in the p-type guard rings 12, causing electric field concentration in the curved areas or portions 14. On the other hand, to secure a high breakdown voltage by the p-type guard rings 12 whose surface concentration is approximately the same as the impurity concentration of the n-type semiconductor substrate 1, it is necessary to increase the depth of the p-type guard rings 12, which is not desirable because the diffusion time and variations are increased.

More specifically, where the surface concentration of the p-well regions 2 is more than 100 times higher than the impurity concentration of the n-type semiconductor substrate 1, an appropriate range of the surface concentration of the p-type guard rings 12 is 10 to 100 times the impurity concentration of the n-type semiconductor substrate 1. For example, where the impurity concentration of the n-type semiconductor substrate 1 is about $1\times10^{14}$ cm$^{-3}$ and the surface concentration of the p-well regions 2 is about $1\times10^{18}$ cm$^{-3}$, the surface concentration of the p-type region 11 and the p-type guard rings 12 should be set in an approximate range of $1\times10^{15}$ cm$^{-3}$ to $1\times10^{17}$ cm$^{-3}$.

The surface concentration of an ordinary RESURF region is approximately equal to the impurity concentration of the n-type semiconductor substrate 1. The surface concentration of the p-type region 11 and the p-type guard rings 12 in the present embodiments is higher than that of the ordinary RESURF region. Therefore, the p-type region 11 and the p-type guard rings 12 are less susceptible to external charge. Therefore, the insulating films 16 and 19 on or over the p-type region 11 and the p-type guard rings 12 can be thinner. Being less susceptible to external charge results, not only from the fact that the conductor layers 17 formed over the p-type guard rings 12 serve as shields for avoiding the influence of external charge, but from also the fact that since the surface concentration of the p-type guard rings 12 is high, regions close to the surfaces of the p-type guard rings 12 are not depleted easily, making the surface electric fields weak. Since the p-type guard rings 12 are less susceptible to external charge, the insulating films 16 and 19 formed on or over the p-type guard rings 12 can be thinner, making it possible to shorten the time for forming the insulating films 16 and 19 and lowering the manufacturing cost.

In a conventional RESURF structure, it is necessary to form a deep, low-impurity-concentration RESURF region, which requires a long-term driving for introducing an impurity deep into the substrate. In contrast, in the present device, since the impurity concentration of the p-type guard rings 12 is high and its diffusion depth can be made smaller than that of a RESURF region, long-term driving is not necessary, further reducing the manufacturing cost. Furthermore, since the variation in the degree of horizontal diffusion in forming the p-type guard rings 12 can be reduced, their shapes can be controlled accurately, thereby increasing the yield relating to the shapes to reduce the manufacturing cost.

The diffusion depth of the p-type region 11 and the p-type guard rings 12 can be greater than that of the p-well regions 2 and smaller than about 1/10 of the thickness (about 60 μm in the case of 600-V-class devices) of the vertical breakdown voltage maintaining region (commonly called a drift layer; the non-diffused portion whose thickness is the thickness of the n-type semiconductor substrate 1 minus the depth of the p-well regions 2 and the diffusion depth of an n-type drain region).

If the total surface area of the conductor layers 17 accounts for 80% to 90% of that of the p-type region 11 and the p-type guard rings 12, the effect of avoiding the influence of external charge can be enhanced. For example, for a semiconductor device with a 700V breakdown voltage, if the semiconductor device's width of the breakdown voltage structure is 180 μm, and the number of the p-type guard rings 12 is 4, and the gaps 18 between the conductor layers 17 can be 3 μm to 8 μm, preferably 5 μm. It should be noted that the total surface area of the conductor layers 17 exceeding 90% of the surface area of the p-type region 11 and the p-type guard rings 12 is not preferable because equipotential lines that pass through the gaps between the conductor layers 17 and extend outwardly become dense in the p-type guard rings 12 so that the curved portions 14 become prone to electric field concentration, reducing the breakdown voltage.

Moreover, the area covered by the conductor layers 17, the p-type region 11, and the p-type guard rings 12 can be 70% or more (breakdown voltage maintaining structure viewed from above the plan view). Moreover, the distance t (μm) of the gaps 18 between the adjacent conductor layers 17 satisfies the following relational expression: $(\rho\times100\div Vbr)<t<(\rho\times350\div Vbr)$, where ρ in Ω·cm represents the resistivity of the n-type semiconductor substrate 1, which is a main part of the voltage maintaining layer, and Vbr in V is the breakdown voltage of the semiconductor device.

If a portion for restricting (determining) the breakdown voltage is disposed in the active portion 26 by a design that the breakdown voltage of the p-type region 11 and the p-type guard rings 12 is 5% higher than that of the active portion 26, a sufficient device breakdown voltage can be secured even if the breakdown voltage reduction of less than 5% occurs because of influence of external charge.

Figure 2:
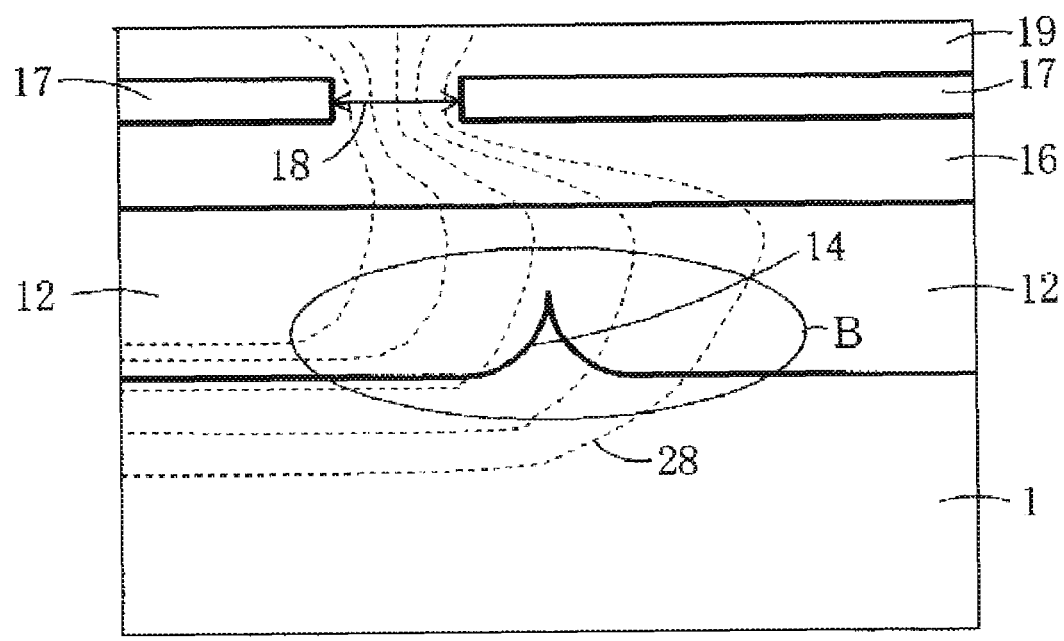
FIG. 2 is an equipotential line diagram of a p-type guard ring forming portion.

FIG. 2 is an enlarged section A of FIG. 1 illustrating an equipotential line diagram of the p-type guard ring forming portion. Equipotential lines 28 are curved according to the curvature of the curved portion 14 of the inside p-type guard ring 12 and extend outwardly through the gap 18 between the conductor layers 17 formed over the p-type guard rings 12. In the curved portions 14, the impurity concentration gradually decreases toward the n-type semiconductor substrate 1 and the pn junction of this portion is a graded junction. Therefore, the equipotential lines 28 extend into the curved portions 14 (low-impurity-concentration portions) of the p-type guard rings 12 and are bent, and extend outwardly through the gap 18 between the conductor layers 17. For the equipotential lines 28 to be bent and extend out of the n-type semiconductor substrate 1, it is necessary for the p-type guard rings 12 to be separated from each other or their curved portions 14 (low-impurity-concentration portions) to be connected to each other in the case where the p-type guard rings 12 are connected to each other.

In particular, where the impurity concentration of the p-type guard rings 12 is as high as more than 10 times that of the n-type semiconductor substrate 1, it is necessary for their connecting portions to be low-impurity-concentration curved portions.

Since as shown in FIG. 1 each conductor layer 17 is formed in such a manner that its inside end portion is located over the p-type guard ring 12 located immediately inside the corresponding p-type guard ring 12, equipotential lines 28 that extend outwardly through the gap 18 between the conductor layer 17 concerned and the immediately inside conductor layer 17 bulge outside in a region B, increasing their intervals there. Therefore, the electric field strength is weaker there than in the conventional guard ring structure, allowing the p-type guard ring forming portion 27 to be made shorter.

Although in the first embodiment the breakdown voltage maintaining structure is applied to the power MOSFET, which can be a vertical device, it can be applied to a power IGBT. In the latter case, the n-type source regions 3 and the n-type drain region (not shown) are replaced by n-type emitter regions and a p-type collector region, respectively. Alternatively, the breakdown voltage maintaining structure can be applied to a diode or a thyristor. In the case of a diode, the MOS gate portions and the p-well regions 2 are not necessary and the n-type source regions 3 and the n-type drain region (not shown) are replaced by n-type cathode regions and a p-type anode region, respectively. In the case of a thyristor, the MOS gate portions are not necessary, the n-type source regions 3 and the n-type drain region (not shown) are replaced by n-type cathode regions and a p-type anode region, respectively, and the p-well regions 2 are replaced by p-type base regions (gate electrodes are formed in the p-type base regions).

Figure 3:
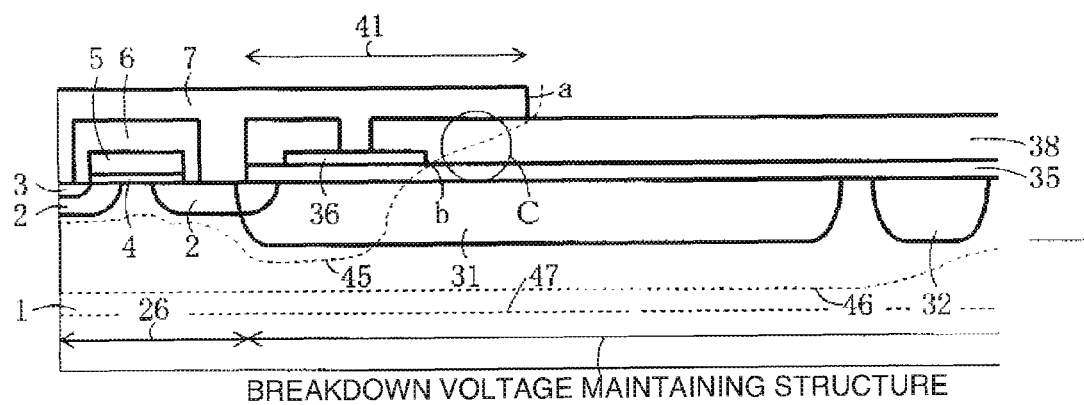
FIG. 3 is a sectional view of a second embodiment of a semiconductor device according to the present invention.
Figure 3:
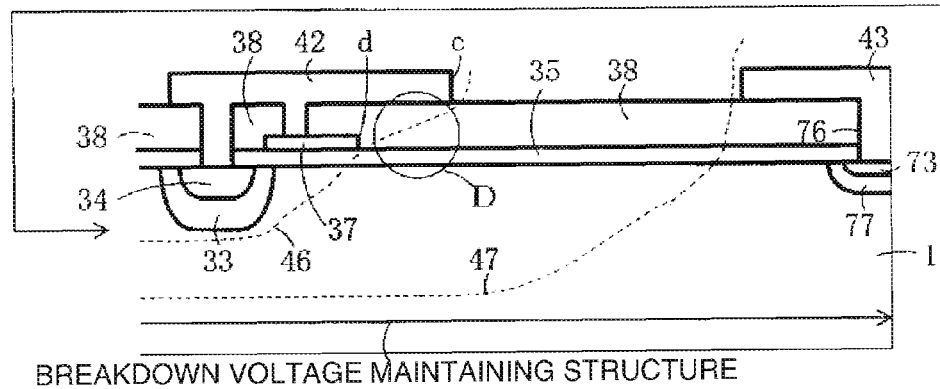

Referring to FIG. 3, the second embodiment the semiconductor device also can be a vertical power MOSFET. The second embodiment can include a long p-type region 31 (e.g., first semiconductor region) formed in the n-type semiconductor substrate 1, a conductor layer 36 formed over the p-type region 31 with an insulating film 35 interposed in between, and a longer field plate 41 formed over the conductor layer 36 with an insulating film 38 interposed in between and connected to the conductor layer 36. Moreover, the second embodiment further can include a second field plate 42, which is connected to an outermost p-type guard ring 33 (e.g., second semiconductor region), and a second conductor layer 37 formed over the n-type semiconductor substrate 1 with the insulating film 35 interposed in between. The active portion 26 can be the same as the first embodiment.

The breakdown voltage maintaining structure includes the p-type region 31 formed as a surface layer in the n-type semiconductor substrate 1 at an impurity concentration that is lower than the impurity concentration of the p-well regions 2 and higher than the impurity concentration of the n-type semiconductor substrate 1, with a greater diffusion depth than the p-well regions 2 and in contact with the outermost p-well region 2. The structure further includes an innermost p-type guard ring 32 (e.g., second semiconductor region) formed adjacent to the p-type region 31. The p-type region 31 can be long like a RESURF region. The insulating film 35 is formed on the p-type region 31 and the p-type guard ring 32, and the conductor layer 36 is formed over the p-type region 31 with the insulating film 35 interposed in between. The conductor layer 36 can be a polysilicon film or a metal film. The insulating film 38 is formed on the conductor layer 36, and the field plate 41, which is connected to the outermost p-well region 2, is formed by extending the source electrode 7 outwardly and connecting to or contacting with the conductor layer 36. The outer end b of the conductor layer 36 is located inside the outer end a of the field plate 41.

Since the field plate 41 extends and covers an inner end portion of the p-type region 31 and the outer end b of the conductor layer 36 is located inside the outer end a of the field plate 41, equipotential lines 45 are bent obliquely in a region C to thereby occupy a wider region in the p-type region 31. This makes it possible to shorten the breakdown voltage maintaining structure. Furthermore, since the impurity concentration of the p-type region 31 is set higher than that of a RESURF structure, it can be made less susceptible to external charge.

The outermost p-type guard ring 33 is formed outer side of the p-type guard ring 32. The second field plate 42, which is connected to the p-type guard ring 33 and the second conductor layer 37, is formed over the n-type semiconductor substrate 1 with the insulating film 35 interposed in between, and the outer end d of the second conductor layer 37 is located inside the outer end c of the second field plate 42. As a result, equipotential lines 46, which develop outside the second guard ring 33, are bent obliquely in a region D to thereby occupy a wider region in the n-type semiconductor substrate 1. The breakdown voltage maintaining structure thus can be made as short as in a case where a RESURF structure is employed. Equipotential lines 47 correspond to a case where rated voltages of the device are applied.

As for the specifics, for example, the impurity concentration and the diffusion depth of the p-well regions 2 can be about $2 \times 10^{17}$ cm$^{-3}$ and about 3 to 5 μm, respectively. The impurity concentration of the p-type region 31 and the p-type guard rings 32 and 33 can be about $5 \times 10^{15}$ cm$^{-3}$. Since the impurity concentration of the p-type region 31 and the p-type guard rings 32 and 33 is low, their pn junctions are graded junctions. When a reverse voltage is applied, wide depletion layers develop in the p-type region 31 and the p-type guard rings 32 and 33, so that electric field concentration can thereby be prevented. Reference numeral 34 in FIG. 3 denotes a p-type contact region.

The formation of polysilicon layers makes it possible to employ an ordinary semiconductor manufacturing process. Setting the surface concentrations of the first, second, and third semiconductor regions at 10-100 times higher than the impurity concentration of the semiconductor layer can make the semiconductor device less susceptible to external charge.

Conductor layers can be formed over respective guard rings with an insulating film interposed in between. An inside end portion of each conductor layer can project over the guard ring that is located immediately inside the corresponding guard ring and the impurity concentration of the guard rings can be set between the impurity concentrations of the well regions and its semiconductor substrate. This arrangement allows a shorter guard ring forming portion, making it possible to reduce the chip size.

The conductor layers can be formed over the respective guard rings and the impurity concentration of the guard rings can be set higher than that of the semiconductor substrate. This allows the device to be less susceptible to external charge, allowing a thinner insulating film on the guard rings.

The intervals between equipotential lines developing in the semiconductor region and the semiconductor substrate can be increased, allowing a shorter breakdown voltage maintaining structure. As a result, the chip size can be reduced.

Since the chip size can be reduced and the insulating film can be made thinner according to the present disclosure, the manufacturing cost can be reduced.

While the present invention has been particularly shown and described with reference to preferred embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on and claims priority to Japanese Patent Application 2007-183530 filed on 12 Jul. 2007. The disclosure of the priority application in its entirety, including the drawings, claims, and the specification thereof, is incorporated herein by reference.

What is claimed is:

1. A semiconductor device comprising:
a semiconductor layer of a first conductivity type;
an active portion having at least one well region of a second conductivity type selectively positioned in the semiconductor layer; and
a breakdown voltage maintaining structure surrounding the active portion,
wherein the breakdown voltage maintaining structure comprises:
a first semiconductor region of the second conductivity type in the semiconductor layer at an impurity concentration lower than that of at least one well region and higher than that of the semiconductor layer, and surrounding and in contact with an outermost well region among the at least one well region;
a plurality of second semiconductor regions of the second conductivity type at the same impurity concentration and with the same diffusion depth as the first semiconductor region in the semiconductor layer, and surrounding the first semiconductor region;
a first conductor layer positioned over the first semiconductor region with an insulating film interposed in between; and
a plurality of second conductor layers, each positioned over at least one of the second semiconductor regions with the insulating film interposed in between, and spaced from each other,
wherein each of the second conductor layers is in contact with one of the second semiconductor regions,
wherein the first conductor layer and an innermost second conductor layer among the second conductor layers are spaced from each other,
wherein the first conductor layer is in electrical contact with the outermost well region,
wherein an innermost second semiconductor region among the second semiconductor regions extends into and is in contact with the first semiconductor region,
wherein an inner side end portion of the innermost second conductor layer, which is associated with the innermost second semiconductor region, extends over to the first semiconductor region,
wherein at least some of the second semiconductor regions overlap or are in contact with each other.

2. The semiconductor device according to claim 1, wherein an inner side end portion of an outermost second conductor layer among the second conductor layers, which outermost second conductor layer is associated with an outermost second semiconductor region among the second semiconductor regions, extends over to the second semiconductor region adjacent thereto.

3. The semiconductor device according to claim 1, wherein the amount of spacing between adjacent second semiconductor regions becomes wider as the second semiconductor regions are positioned farther outwardly from the first semiconductor region.

4. The semiconductor device according to claim 1, wherein:
a boundary between each of the first and second semiconductor regions and the semiconductor layer includes a curved portion, and
adjacent end portions of adjacent curved portions overlap, touch, or have a gap therebetween,
the spacing between the overlap or gap becomes wider as the second semiconductor regions are position farther outwardly from the first semiconductor region.

5. The semiconductor device according to claim 1, wherein the breakdown voltage maintaining structure further includes contact regions in the second semiconductor regions at an impurity concentration that is higher than that of the second semiconductor regions.

6. The semiconductor device according to claim 1, wherein:
a surface concentration of the at least one well region is more than 100 times higher than the impurity concentration of the semiconductor layer, and
the surface concentrations of the first and second semiconductor regions are 10 to 100 times higher than the impurity concentration of the semiconductor layer.

7. The semiconductor device according to claim 1, wherein each of the first semiconductor region, the second semiconductor regions, the first conductor layer, and the second conductor layers is loop shaped.

8. The semiconductor device according to claim 1, wherein the second semiconductor regions are guard rings.

9. A semiconductor device comprising:
a semiconductor layer of a first conductivity type;
an active portion having at least one well region of a second conductivity type selectively positioned in the semiconductor layer; and
a breakdown voltage maintaining structure surrounding the active portion,
wherein the breakdown voltage maintaining structure comprises:
a first semiconductor region of the second conductivity type in the semiconductor layer at an impurity concentration lower than that of the at least one well region and higher than that of the semiconductor layer, and surrounding and in contact with an outermost well region among the at least one well region;
a plurality of second semiconductor regions of the second conductivity type at the same impurity concentration and with the same diffusion depth as the first semiconductor region in the semiconductor layer, and surrounding the first semiconductor region;
a first conductor layer positioned over the first semiconductor region with a first insulating film interposed in between;
a first field plate positioned over the first conductor layer with a second insulating film interposed in between; and
a plurality of second conductor layers, each positioned over at least one of the second semiconductor regions with the first insulating film interposed in between and are spaced from each other,
wherein the first field plate is in contact with the outermost well region and is in contact with the first conductor layer, wherein an outer side end of the first field plate extends outwardly beyond an outer side end of the first conductor layer, wherein an innermost second semiconductor region among the second semiconductor regions extends into and is in contact with the first semiconductor region, wherein an inner side end portion of an innermost second conductor layer among the second conductor layers, which innermost second conductor layer is associated with the innermost second semiconductor region, extends over to the first semiconductor region, and wherein at least some of the second semiconductor regions overlap or are in contact with each other.

10. The semiconductor device according to claim 9, wherein the breakdown voltage maintaining structure further comprises:

a plurality of second field plates each positioned over one of the second conductor layers with the second insulating film interposed in between, wherein an outermost second field plate among the second field plates is in contact with an outermost second semiconductor region among the second semiconductor regions, and wherein an outer side end of the outermost second field plate extends outwardly beyond an outer side end of the outermost second conductor layer.

11. The semiconductor device according to claim 10, wherein each of the first semiconductor region, the second semiconductor regions, the first conductor layer, and the second conductor layer is loop shaped.

12. The semiconductor device according to claim 10, wherein the second semiconductor regions comprise a plurality of guard rings.

13. The semiconductor device according to claim 10, wherein each of the first and second conductor layers comprises a low-resistivity layer, a metal film, or a lamination of a low-resistivity layer and a metal film.

14. The semiconductor device according to claim 13, wherein the low-resistivity layer is made of polysilicon.

15. The semiconductor device according to claim 9, wherein an inner side end portion of an outermost second conductor layer among the second conductor layer, which outermost second conductor layer is associated with an outermost second semiconductor region among the second semiconductor regions, extends over to the second semiconductor region adjacent thereto.

16. The semiconductor device according to claim 15, wherein the outermost second semiconductor region is spaced from the adjacent second semiconductor region, while remaining second semiconductor regions are overlapping or in contact with the adjacent second semiconductor regions.

17. The semiconductor device according to claim 15, wherein each of the first semiconductor region, the second semiconductor region, the first conductor layer, and the second conductor layers is loop shaped.

18. A method of manufacturing a semiconductor device comprising the steps of:

forming an active portion having at least one well region of a second conductivity type selectively in a semiconductor layer of a first conductivity type;

forming a breakdown voltage maintaining structure surrounding the active portion by:

forming a first semiconductor region of the second conductivity type in the semiconductor layer at an impurity concentration lower than that of the at least one well region and higher than that of the semiconductor layer, and surrounding and in contact with an outermost well region among the at least one well region;

forming a plurality of second semiconductor regions of the second conductivity type at the same impurity concentration and with the same diffusion depth as the first semiconductor region in the semiconductor layer, and surrounding the first semiconductor region;

forming a first conductor layer positioned over the first semiconductor region with an insulating film interposed in between; and forming a plurality of second conductor layers, each positioned over at least one of the second semiconductor regions with the insulating film interposed in between, and spaced from each other, wherein each of the second conductor layers is in contact with one of the second semiconductor regions, wherein the first conductor layer and an innermost second conductor layer among the second conductor layer are spaced from each other, wherein the first conductor layer is in electrical contact with the outermost well region, wherein an innermost second semiconductor region among the second semiconductor regions is in contact with the first semiconductor region, wherein an inner side end portion of the second conductor layer, which is associated with the innermost second semiconductor region, extends over to the first semiconductor region, and wherein at least some of the second semiconductor regions overlap or are in contact with each other.

19. The method according to claim 18, further including the step of forming a first field plate positioned over the first conductor layer with the insulating film interposed in between, with the first field plate in contact with the outermost well region and in contact with the first conductor layer, and with an outer side end of the first field plate extending outwardly beyond an outer side end of the first conductor layer.

20. The method according to claim 19, further comprising the steps of:

forming a plurality of second field plates, each positioned over one of the second conductor layers with the second insulating film interposed in between, wherein an outermost second field plate among the second field plates is in contact with an outermost second semiconductor region among the second semiconductor regions, and wherein an outer side end of the outermost second field plate extends outwardly beyond an outer side end of the outermost second conductor layer.

* * * * *